(12) United States Patent
Kamijima (10) Patent No.: US 8,440,953 B2
(45) Date of Patent: May 14, 2013

(54) LASER BEAM SOURCE DEVICE, PROJECTOR, AND MONITORING DEVICE HAVING DUAL LIGHT EMISSION ELEMENTS WITH NON-UNIFORM LIGHT EMISSION PORTIONS

(75) Inventor: Shunji Kamijima, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 312 days.

(21) Appl. No.: 12/894,606

(22) Filed: Sep. 30, 2010

(65) Prior Publication Data
US 2011/0122372 A1   May 26, 2011

(30) Foreign Application Priority Data

Nov. 26, 2009   (JP) ................................. 2009-268451

(51) Int. Cl.
*H01L 27/00* (2006.01)
(52) U.S. Cl.
USPC ....................................... 250/208.1; 250/216

(58) Field of Classification Search ............... 250/208.1, 250/216, 226, 227.12, 227.21; 353/31, 20, 353/94–99; 362/241–247, 257, 19
See application file for complete search history.

(56) References Cited

U.S. PATENT DOCUMENTS
7,303,283 B2 * 12/2007 Yatsu .............................. 353/20

FOREIGN PATENT DOCUMENTS
JP    A-2004-363414    12/2004

* cited by examiner

*Primary Examiner* — Que T Le
(74) *Attorney, Agent, or Firm* — Oliff & Berridge, PLC (57) ABSTRACT

A laser beam source device includes: a first light emission element and a second light emission element each of which has a light emission portion for emitting a laser beam having a fundamental wavelength, wherein the first light emission element and the second light emission element are disposed such that light emitted from the light emission portion of each of the first light emission element and the second light emission element can enter the light emission portion of the other light emission element, at least either the first light emission element or the second light emission element has the plural light emission portions, and the areas of the plural light emission portions are not uniform.

9 Claims, 7 Drawing Sheets

LASER BEAM SOURCE DEVICE, PROJECTOR, AND MONITORING DEVICE HAVING DUAL LIGHT EMISSION ELEMENTS WITH NON-UNIFORM LIGHT EMISSION PORTIONS

BACKGROUND

1. Technical Field

The present invention relates to a laser beam source device, a projector, and a monitoring device, and more particularly to a laser beam source device capable of producing high output.

2. Related Art

A high-pressure mercury lamp has been often used as an illumination light source of an optical apparatus such as a projector. However, the high-pressure mercury lamp has several problems such as limited color reproducibility, insufficient rapidity in lighting, and short life. For solving these problems, a laser beam source device applicable in this field has been under development. Particularly, a laser beam source device having an external resonator structure capable of intensifying light having a particular wavelength by using the external resonator has been developed to produce high output. According to this type of laser beam source device, however, it is difficult to obtain a sufficient amount of light in some cases only by laser beam generation depending on wavelengths of light. Thus, a technology which generates light having a fundamental wavelength such as a infrared laser beam and then converts the infrared laser beam into visible light having a ½ wavelength by using a wavelength converging element such as a second harmonic generator (hereinafter abbreviated as SHG) has been employed.

According to this technology, the laser beam needs to be amplified by successive inductive discharge generated through reciprocation of the laser beam several times within a laser generator. However, when the optical axis of the laser beam deviates even only slightly, sufficient reciprocation of the laser beam cannot be achieved. In this case, lasers cannot be generated. For overcoming this drawback, a method for preventing lowering of alignment accuracy caused by thermal lens effect of a laser excitation medium by using a concaved reflection surface of an external resonating mirror has been proposed (for example, see JP-A-2004-363414). According to the description of this reference, the output laser beam reflected by the concaved reflection surface of the external resonating mirror returns toward the optical axis even when the output laser beam expands or deviates by the thermal lens effect of the laser excitation medium. By this method, sufficient output is expected to be produced.

According to this structure, however, extremely accurate alignment is required between a laser diode and the external resonating mirror in some cases so as to generate sufficient laser generation by using the laser generator having the external resonator structure. In this case, there is a possibility that sufficient alignment accuracy cannot be secured when the method disclosed in JP-A-2004-363414 is employed. In addition, the necessity for high alignment accuracy becomes an obstacle to stable manufacture of a low-cost laser beam source device.

Moreover, even when sufficient alignment accuracy is secured between the laser excitation medium and the external resonating mirror by using the laser generator having the external resonator structure, increase in the output of the laser is still limited.

SUMMARY

An advantage of some aspects of the invention is to provide a laser beam source device which can produce sufficient laser generation for achieving high output. It is another advantage of some aspects of the invention to provide a technology of producing this laser beam source device at low cost in a stable manner. Another advantage of some aspects of the invention is to provide a projector and a monitoring device including this laser beam source device.

A laser beam source device according to an aspect of the invention includes a first light emission element and a second light emission element each of which has a light emission portion for emitting a laser beam having a fundamental wavelength. The first light emission element and the second light emission element are disposed such that light emitted from the light emission portion of each of the first light emission element and the second light emission element can enter the light emission portion of the other light emission element. At least either the first light emission element or the second light emission element has the plural light emission portions. The areas of the plural light emission portions are not uniform.

According to this structure which includes laser diodes at both ends of a resonator, the laser beam is amplified by successive inductive discharge generated through reciprocation of the laser beam between the two light emission elements. In this case, an external resonator need not be equipped, which reduces the size of the device. Moreover, the amplification of the laser beam produced by this structure is expected to be larger than that of a structure including the external resonator, which allows the laser beam source device to be more appropriate for production of high output.

Moreover, according to this structure, at least either the first light emission element or the second light emission element has the plural light emission portions, and the areas of the plural light emission portions are not uniform. For alignment of the light emission elements at least either of which has the plural light emission portions, in the plane where plural light emission portions are disposed the most reasonable method is that one of the light emission portions is initially aligned, based on the light emission portion the other light emission portions are aligned after completion of the initial alignment. According to this method, the alignment process can be easily performed when each area of the other light emission portions is larger than the area of the light emission portion as the reference.

In this case, the necessary alignment accuracy lowers, allowing sufficient lasers to be generated. Accordingly, the laser beam source device capable of producing high output can be manufactured at low cost in a stable manner. Since the adjustment can be carried out by using a simple alignment device as a result of the lowered necessary alignment accuracy, the alignment can be performed easily and rapidly with a high yield. Accordingly, the laser beam source device can be produced at low cost for these reasons.

In the laser beam source device of the above aspect of the invention, it is preferable that the area of the light emission portion included in the plural light emission portions of at least either the first light emission element or the second light emission element and positioned near the end of the element is larger than the area of the light emission portion positioned near the center of the element.

For alignment between the light emission elements at least either of which has the plural light emission portions, the most reasonable method is that the light emissions portion positioned at the center of the element is initially aligned within a plane where the plural light emission portions are disposed. After this alignment is finished, the corresponding light emission element is rotated around the light emission portion at the center within this plane. Then, the light emission portions positioned at the end of the element is performed. When this method is used, the shift distance of the light emission portion positioned at the end of the element is longer than that of the light emission portion positioned at the center of the element at the time of rotation. Thus, the alignment can be easily carried out when each area of the light emission portions positioned near the ends of the elements is larger than the area of the light emission portion positioned near the center of the element.

Alternatively, in the laser beam source device of the above aspect of the invention, it is preferable that the areas of the plural light emission portions of at least either the first light emission element or the second light emission element sequentially increase in the direction from one end of the element to the other end of the element.

For alignment between the light emission elements at least either of which has the plural light emission portions, the following method may be adopted. The light emission portion positioned near one end of the element is initially aligned within the plane where the plural light emission portions are disposed. After this alignment is finished, the corresponding light emission element is rotated around the light emission portion at the one end within this plane. Then, the light emission portion positioned near the other end of the element is aligned. When this method is used, the shift distance of the light emission portion sequentially increases in the direction from the light emission portion positioned near the one end of the element toward the light emission portion positioned near the other end at the time of rotation. Thus, the alignment can be easily performed when the areas of the light emission portions sequentially increase in the direction from the light emission portion positioned near one end of the element to the light emission portion positioned near the other end.

In the laser beam source device of the above aspect of the invention, it is preferable that the area of the light emission portion of the first light emission element is different from the area of the light emission portion of the second light emission element which receives light emitted from the corresponding light emission portion of the first light emission element.

According to this structure, the area of the light emission portion of the first light emission element is different from the area of the light emission portion of the second light emission element which receives the light emitted from the corresponding light emission portion of the first light emission element. In this case, the periphery of the light emission portion having the larger area functions as an alignment margin as viewed from the light emission portion having the smaller area. Thus, both the light emission portions completely overlap with each other even when the alignment of the light emission portion having the smaller area deviates from the light emission portion having the larger area within the range of the alignment margin on the periphery. Accordingly, the alignment process can be easily performed.

It is preferable that the laser beam source device of the above aspect of the invention further includes: a wavelength converting element which receives lights emitted from the first light emission element and the second light emission element, converts the received lights into lights having a converted wavelength different from the fundamental wavelength, and releases the converted lights; and dividing elements disposed on optical paths between the wavelength converting element and the first light emission element and between the wavelength converting element and the second light emission element to selectively transmit either the laser beam having the converted wavelength or the laser beam having the fundamental wavelength and selectively reflect the other laser beam.

According to this structure, laser beams having other fundamental wavelength can be received from the first light emission element and the second light emission element even when a sufficient amount of laser beams having a desired fundamental wavelength cannot be obtained. Then, beams having a desired wavelength can be produced as lights having the converted wavelength different from the fundamental wavelength by the function of the wavelength converting element. Subsequently, the laser beams having the converted wavelength and the laser beams having the fundamental wavelength can be divided and extracted by the function of the dividing elements.

In the laser beam source device of the above aspect of the invention, the first light emission element and the second light emission element may be mounted on the same substrate, and the laser beam having the fundamental wavelength and emitted from either the first light emission element or the second light emission element may be reflected by the one dividing element, supplied to the wavelength converting element, released from the wavelength converting element, reflected by the other dividing element, and supplied to the other light emission element.

Generally, a light emission element which emits laser beams increases its temperature at the time of generation of lasers and thus needs cooling. In case of a surface-emission-type light emission element, the light emission element is mounted on each of substrates disposed at both ends of a resonator structure such that light emission portions of the respective light emission elements can be opposed to each other, for example. In this case, however, the two substrates each requiring cooling are needed, which complicates or enlarges the structure of a cooling mechanism. According to this structure, the first light emission element and the second light emission element are mounted on the same substrate, and the laser beams emitted from each of the light emission elements are reflected by the dividing elements and supplied to the wavelength converting element. Thus, the structure of the cooling mechanism is simplified, and the size of the device is not increased.

It is preferable that the laser beam source device of the above aspect of the invention further includes an optical path changing unit which bends the optical path of the laser beam emitted from either the first light emission element or the second light emission element and transmitted by the other dividing element substantially in the same direction as the direction of the optical path of the laser beam emitted from the other light emission element and transmitted by the one dividing element.

When the first light emission element and the second light emission element are mounted on the same substrate, the laser beams having the converted wavelength to be finally used are transmitted by the corresponding wavelength converting elements and supplied in different directions. According to this structure, however, the optical path changing unit bends the optical path of the laser beam transmitted by the other dividing element substantially in the same direction as that of the optical path of the laser beam transmitted by the one dividing element. Thus, the laser beam having raised output can be released in the same direction, and thus can be easily used by an arbitrary optical system disposed downstream.

A projector according to another aspect of the invention includes: the laser beam source device of the above aspect of the invention; a light modulation device which modulates a laser beam emitted from the laser beam source device according to an image signal; and a projection device which projects light modulated by the light modulation device.

The projector according to this aspect of the invention includes the laser beam source device of the above aspect of the invention. Thus, the projector capable of displaying bright images can be produced at low cost.

A monitoring device according to still another aspect of the invention includes: the laser beam source device of the above aspect of the invention; and an image pickup unit which produces an image of a subject by using light emitted from the laser beam source device.

The monitoring device according to this aspect of the invention includes the laser beam source device of the above aspect of the invention. Thus, the monitoring device capable of capturing clear images can be produced at low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment of the invention is hereinafter described with reference to FIGS. 1 through 8.

In this embodiment, an example of a laser beam source device having two surface-emission-type laser diodes will be discussed.

Figure 1:
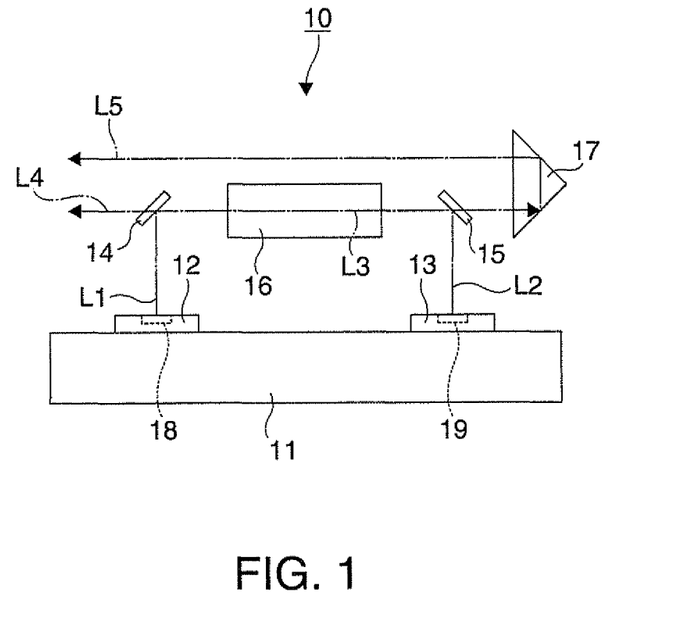
FIG. 1 illustrates the general structure of a laser beam source device according to a first embodiment of the invention.

FIG. 1 illustrates the general structure of the laser beam source device according to this embodiment. FIGS. 2 through 8 are plan views showing various examples of emitter shapes provided on the respective laser diodes. In the respective figures, reduction scales are varied for each of the constituent elements such that these elements can be visually recognized with ease.

As illustrated in FIG. 1, a laser beam source device 10 in this embodiment includes a substrate 11, a first laser diode 12 (first light emission element), a second laser diode 13 (second light emission element), a first wavelength selecting mirror 14 and a second wavelength selecting mirror 15 (dividing elements), a wavelength converting element 16, and an optical path changing prism 17 (optical path changing unit). The first laser diode 12 and the second laser diode 13 are surface-emission-type laser diodes each of which emits infrared laser beams (laser beams having a fundamental wavelength) from a chip upper surface, and have circular emitters 18 and 19 (light emission portions) in the plan view, respectively, on the upper parts of the first and second laser diodes 12 and 13. The first laser diode 12 and the second laser diode 13 are mounted on the single substrate 11 with the light emission surfaces of the diodes 12 and 13 facing upward. Reflection mirrors (not shown) are provided on the sides of the laser diodes 12 and 13 opposite to the light emission sides of the emitters 18 and 19. Each of the reflection mirrors functions as a reflector at one end of a light resonator.

The wavelength converting element 16 is disposed at a position corresponding to an intermediate position between the first laser diode 12 and the second laser diode 13 above the substrate 11 in such a direction that the light transmission direction of the wavelength converting element 16 becomes substantially parallel with the upper surface of the substrate 11. The wavelength converting element 16 in this embodiment is constituted by a second harmonic generator (SHG) as a non-linear optical element which converts entering light into light having a substantially half wavelength (light having a converted wavelength). The wavelength converting element has a periodic domain inversion structure which alternately repeats areas having inverse polarization directions such that the polarization direction of one area becomes opposite to that of the area disposed next with a predetermined pitch within an inorganic non-linear optical crystal such as lithium niobate (LN; $LiNbO_3$) and lithium tantalate (LT: $LiTaO_3$).

The first wavelength selecting mirror 14 and the second wavelength selecting mirror 15 are disposed above the first laser diode 12 and the second laser diode 13, respectively. The first wavelength selecting mirror 14 is positioned such that the angle formed by the light entrance surface of the first wavelength selecting mirror 14 and an optical axis L1 of a laser beam emitted upward from the first laser diode 12 becomes approximately 45 degrees. Similarly, the second wavelength selecting mirror 15 is positioned such that the angle formed by the light entrance surface of the second wavelength selecting mirror 15 and an optical axis L2 of a laser beam emitted upward from the second laser diode 13 becomes approximately 45 degrees.

The wavelength converting element 16 is disposed between the first wavelength selecting mirror 14 and the second wavelength selecting mirror 15, and is positioned such that each angle formed by the light entrance surface of the first wavelength selecting mirror 14 and an optical axis L3 of light passing through the wavelength converting element 16 and formed by the light entrance surface of the second wavelength selecting mirror 15 and the optical axis L3 becomes approximately 45 degrees. By this arrangement, the laser beam emitted upward from the first laser diode 12 is reflected by the first wavelength selecting mirror 14 and enters the wavelength converting element 16. Then, the laser beam released from the wavelength converting element 16 is reflected by the second wavelength selecting mirror 15 and enters the second laser diode 13. On the other hand, the laser beam emitted upward from the second laser diode 13 is reflected by the second wavelength selecting mirror 15 and enters the wavelength converting element 16. Then, the laser beam released from the wavelength converting element 16 is reflected by the first wavelength selecting mirror 14 and enters the first laser diode 12.

According to the laser beam source device 10 in this embodiment, therefore, inductive discharge successively occurs while light is reciprocating several times between the first laser diode 12, the first wavelength selecting mirror 14, the wavelength converting element 16, the second wavelength selecting mirror 15, and the second laser diode 13. As a result, lasers are generated. In this case, a part of the infrared laser beam is converted into visible light by wavelength conversion using the wavelength converting element 16 while the beam is reciprocating between the first laser diode 12 and the second laser diode 13. The first wavelength selecting mirror 14 and the second wavelength selecting mirror 15 have characteristics of reflecting the infrared light having the fundamental wavelength and emitted from the first laser diode 12 and the second laser diode 13, and transmitting visible light converted by the wavelength converting element 16. By these characteristics, the visible light converted by the wavelength converting element 16 passes through the first wavelength selecting mirror 14 or the second wavelength selecting mirror 15 to be released to the side.

Accordingly, in the structure of this embodiment which includes the laser diodes at both ends of the resonator, the laser beam is amplified by successive inductive discharge generated through reciprocation of the laser beam between the two light emission elements. In this case, the external resonator need not be equipped, which reduces the size of the device. Moreover, the amplification of the laser beam produced by this structure is expected to be larger than that by a structure including the external resonator, which allows the laser beam source device to be more appropriate for production of high output.

According to this embodiment, the optical path changing prism 17 for bending the optical path of light released toward the right in FIG. 1 from the second wavelength selecting mirror 15 is equipped. This light is reflected twice inside the optical path changing prism 17, and released in such a direction that an optical path L5 of the light extends substantially in parallel with an optical path L4 of light released from the first wavelength selecting mirror 14 toward the left in FIG. 1. The optical path changing unit is not limited to the prism but may be a combination of plural mirrors, for example. Alternatively, the optical path may be changed by using an arbitrary optical system included in an optical apparatus incorporating the laser beam source device 10 without using the optical path changing unit contained in the laser beam source device 10.

Each diameter of the emitters 18 and 19 of the first laser diode 12 and the second laser diode 13 is several hundreds μm, for example, and the respective emitters 18 and 19 need to be aligned with several μm alignment accuracy for generating lasers. In addition, each rotation angle of the first wavelength selecting mirror 14 and the second wavelength selecting mirror 15 around the axis perpendicular to the sheet surface of FIG. 1 needs to have accuracy within several mrad.

Figure 2:
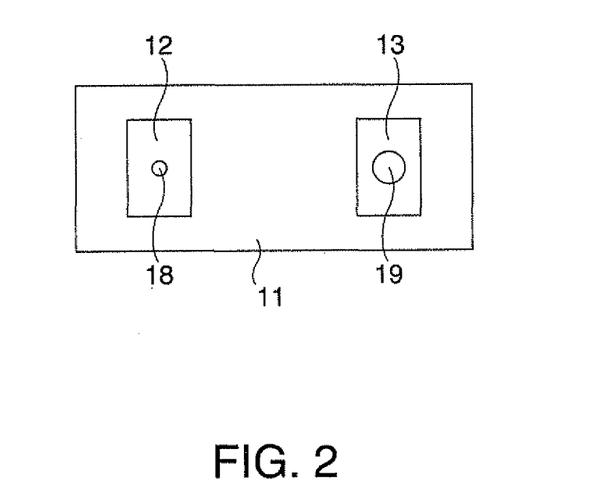
FIG. 2 is a plan view showing a shape example of emitters of respective laser diodes.
Figure 3:
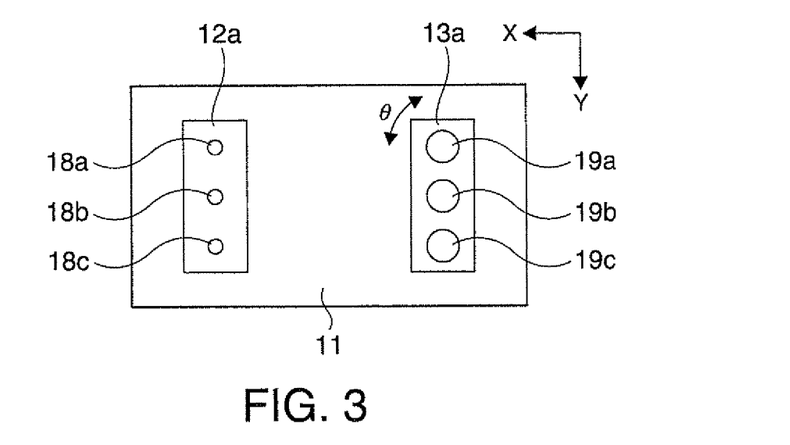
FIG. 3 is a plan view showing another shape example of emitters.

According to an aspect of the invention, the area of the emitter 18 of the first laser diode 12 is different from the area of the emitter 19 of the second laser diode 13. In this embodiment, the area of the emitter 19 of the second laser diode 13 is larger than the area of the emitter 18 of the first laser diode 12 as illustrated in FIG. 2. However, no problem occurs when the area of the emitter 18 of the first laser diode 12 is larger than the area of the emitter 19 of the second laser diode 13. When a first laser diode 12a and a second laser diode 13a have plural emitters 18a through 18c and plural emitters 19a through 19c, respectively, as illustrated in FIG. 3, it is only required that the areas of the plural emitters 19a through 19c of the second laser diode 13a are larger than the areas of the corresponding plural emitters 18a through 18c of the first laser diode 12a. The sizes of the plural emitters contained in each of the laser diode 12a and the laser diode 13a may be either the same or different.

Figure 4:
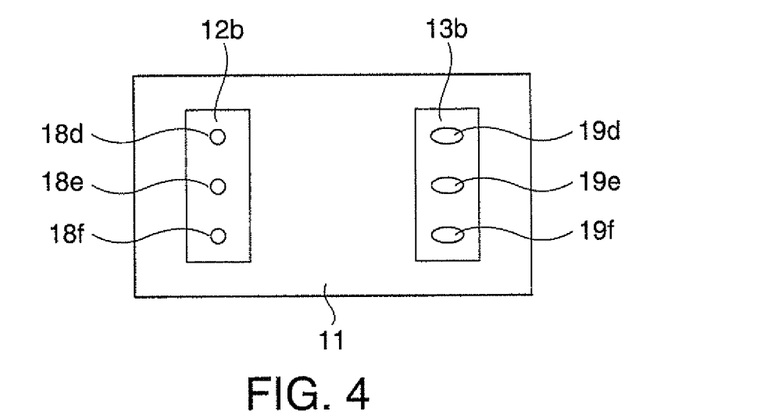
FIG. 4 is a plan view showing a further shape example of emitters.

Alternatively, as illustrated in FIGS. 2 and 3, the shapes of the emitters 18, and 18a through 18c of the first laser diodes 12 and 12a may be similar to the shapes of the emitters 19 and 19a through 19c of the second laser diodes 13 and 13a (both circular shapes), or not similar as illustrated in FIG. 4. According to the example shown in FIG. 4, the shapes of emitters 18d through 18f of the first laser diode 12b having smaller areas are circular, and the shapes of emitters 19d through 19f of the second laser diode 13b having larger areas are elliptic. In case of the examples shown in FIGS. 2 and 3, the peripheries of the circles as the emitter shapes of the second laser diodes 13 and 13a correspond to alignment margins. In case of the example shown in FIG. 4, the alignment margin is produced in the direction of the major axis of each ellipse as the emitter shape of the second laser diode 13b.

For alignment between the emitters 18a through 18c of the first laser diode 12a and the emitters 19a through 19c of the second laser diode 13a in the laser beam source device 10 having the emitter arrangement shown in FIG. 3 in the structure examples herein, for example, either the first laser diode 12a or the second laser diode 13a (for example, the first laser diode 12a) is initially fixed to the substrate 11.

Then, the other laser diode (for example, the second laser diode 13a) is temporarily fixed to the substrate 11. In case of the emitter arrangement shown in FIG. 3, for example, the emitter 19b positioned at the center in the three emitters 19a through 19c and the corresponding emitter 18b are allowed to emit laser beams, and the position of the second laser diode 13a on the substrate surface (X direction and Y direction in FIG. 3) is finely adjusted such that the maximum output can be obtained.

When the position of the second laser diode 13a is determined such that the maximum output can be obtained from the emitters 18b and 19b positioned at the center, the second laser diode 13a is rotated around the center of the second laser diode 13a as the rotation axis within the substrate surface (θ direction in FIG. 3). Then, the rotation angle is finely adjusted such that the maximum outputs can be obtained from the pairs of the emitters 18a and 19a and the emitters 18c and 19c positioned at the ends in the three emitters 18a through 18c and the three emitters 19a through 19c.

While the method of adjusting the relative position of the second laser diode 13a with respect to the first laser diode 12a has been discussed as alignment for obtaining high output, the relative position of the first laser diode 12a with respect to the second laser diode 13a may be adjusted. Alternatively, an optical element such as a mirror and a prism may be inserted on the optical path between the first laser diode 12a and the second laser diode 13a after the positions of the first laser diode 12a and the second laser diode 13a are fixed. Then, the optical path may be controlled through fine adjustment of the position, the angle or the like of the optical element.

Figure 5:
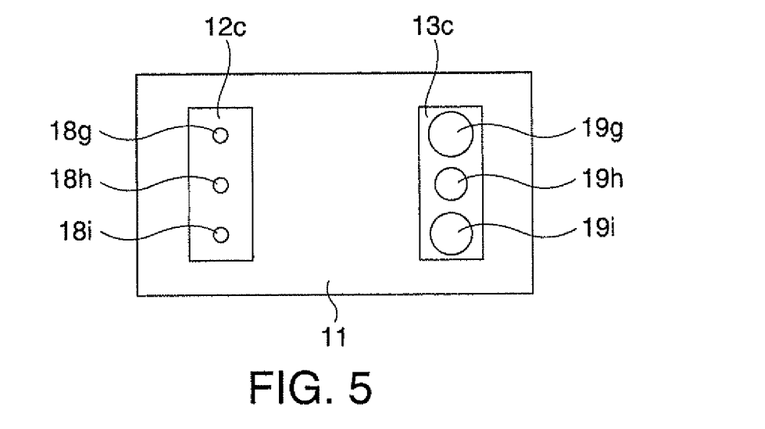
FIG. 5 is a plan view showing a still further shape example of emitters.
Figure 6:
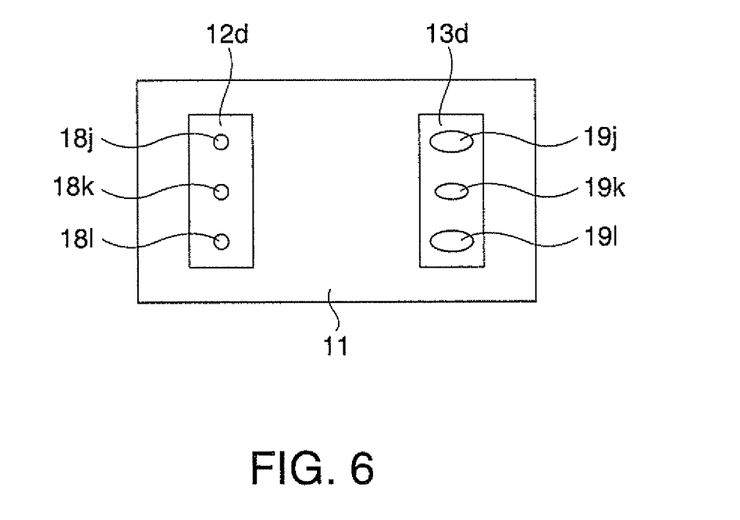
FIG. 6 is a plan view showing a still further shape example of emitters.

According to the alignment method which rotates the laser diode within the substrate surface after determining the center position of the laser diode, the emitter positioned relatively far from the rotation center shifts a longer distance than that of the emitter positioned relatively close to the rotation center at the time of rotation of the laser diode through the predetermined angle. Thus, it is preferable that the emitter positioned away from the rotation center has a larger alignment margin than that of the emitter positioned close to the rotation center. In this case, each area (diameter) of the circles of emitters 19g and 19i positioned at both ends in the three emitters 19g through 19*i* of a second laser diode 13*c* is larger than the area (diameter) of the circle of the emitter 19*h* positioned at the center as illustrated in FIG. 5. Alternatively, it is preferable that each area (diameter) of the ellipses of emitters 19*j* and 19*l* positioned at the ends is larger than the area (diameter) of the ellipse of an emitter 19*k* positioned at the center as illustrated in FIG. 6.

Figure 7:
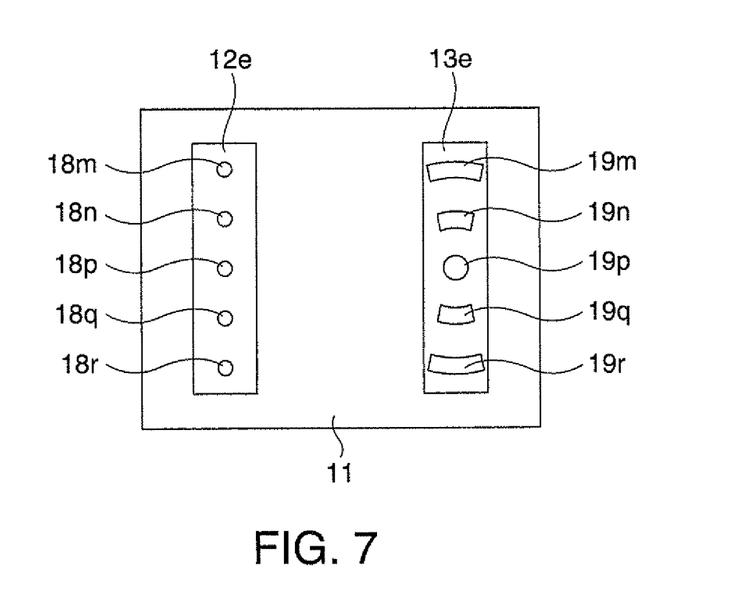
FIG. 7 is a plan view showing a still further shape example of emitters.

In case of the alignment method described above, the respective tracks produced by the shifts of the plural emitters (light receiving positions) at the time of rotation of the laser diode become concentric. Thus, when the shapes of plural emitters 19*m* through 19*r* of a second laser diode 13*e* are circular arc as illustrated in FIG. 7, both ends of each circular arc of the emitters become alignment margins and thus allow the emitters to be more easily aligned.

Figure 8:
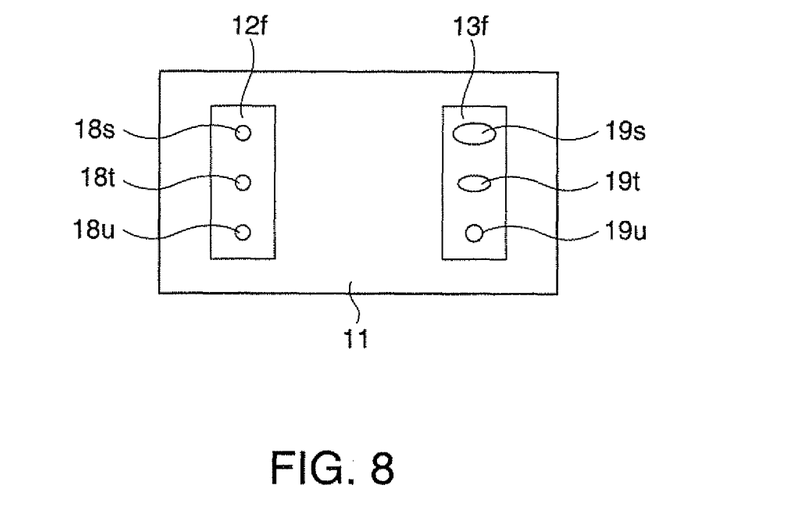
FIG. 8 is a plan view showing a still further shape example of emitters.

Alternatively, as illustrated in FIG. 8, three emitters 18*s* through 18*u* of a first laser diode 12*f* have circular shapes and the same size, an emitter 19*u* of three emitters 19*s* through 19*u* of a second laser diode 13*f* is circular, and the other emitters 19*s* and 19*t* are elliptic. The area of each of the emitters 19*s* through 19*u* is larger than the corresponding area of the three emitters 18*s* through 18*u* of the first laser diode 12*f*. Concerning the three emitters 19*s* through 19*u* of the second laser diode 13*f*, the areas of the emitters 19*s* through 19*u* sequentially increase in the order from the emitter 19*u* positioned at one end to the emitter 19*s* positioned at the other end.

For alignment between the first laser diode 12*f* and the second laser diode 13*f*, the emitter 18*u* and the emitter 19*u* are initially aligned within a plane where the plural emitters are disposed. After this alignment is finished, either the first laser diode 12*f* or the second laser diode 13*f* is rotated around the position of the emitter 18*u* or 19*u* as a rotation center within this plane. Then, alignments between the emitters 18*s* and 19*s* and between the emitters 18*t* and 19*t* are carried out. According to this method, the shift distance of the emitter sequentially increases in the direction from the emitters 18*u* and 19*u* toward the emitters 18*s* and 19*s* at the time of rotation. Thus, the alignment can be easily performed when the areas of the emitters sequentially increase in the direction from the emitter 19*u* positioned at one end of the second laser diode 13*f* to the emitter 19*s* positioned at the other end.

According to the laser beam source device 10 in this embodiment, the area of the emitter 19 of the second laser diode 13 is larger than the area of the emitter 18 of the first laser diode 12. In this structure, the periphery of the emitter 19 included in the second laser diode 13 functions as an alignment margin. In this case, the emitters 18 and 19 of the two laser diodes 12 and 13 completely overlap with each other even when the alignment deviates within the range of the alignment margin on the periphery. Thus, the necessary alignment accuracy is lowered, and sufficient laser generation can be achieved. Accordingly, the laser beam source device capable of producing high output can be manufactured at low cost in a stable manner.

When the area of the emitter of the first laser diode is equivalent to the area of the emitter of the second laser diode, alignment accuracy of 5 µm or smaller is needed, for example. However, the device in this embodiment only requires alignment accuracy of 20 µm or smaller, for example. Since the adjustment can be carried out by using a simple alignment device, the alignment can be performed easily and rapidly with a high yield. Accordingly, the laser beam source device can be produced at low cost for these reasons.

According to the laser beam source device 10 in this embodiment, each area of the plural emitters 19 is not uniform when the plural emitters 19 are provided on the second laser diode 13. For alignment of the light emission element having the plural emitters, the light emission portion having a small area is initially aligned within the plane where the plural light emission portions are disposed. After this alignment is finished, alignment of the other light emission portions is conducted on the basis of the light emission portion initially aligned. In this case, the peripheries of the emitters having large areas function as alignment margins. Thus, even when the alignment deviates within the range of the alignment margins, the emitters 18 and 19 of the two laser diodes 12 and 13 completely overlap with each other. Thus, the necessary alignment accuracy is lowered, and sufficient laser generation can be achieved. Accordingly, the laser beam source device capable of producing high output can be manufactured at low cost in a stable manner.

When the area of the emitter of the first laser diode is equivalent to the area of the emitter of the second laser diode, alignment accuracy of 5 µm or smaller is needed, for example. However, the device in this embodiment only requires alignment accuracy of 20 µm or smaller, for example. Since the adjustment can be carried out by using a simple alignment device, the alignment can be performed easily and rapidly with a high yield. Accordingly, the laser beam source device can be produced at low cost for these reasons.

Moreover, the first laser diode 12 and the second laser diode 13 are mounted on the same substrate 11, and the laser beams emitted from the respective laser diodes 12 and 13 are reflected by the wavelength selecting mirrors 14 and 15 and enter the wavelength converting element 16. Thus, the structure of the cooling mechanism for the laser diodes 12 and 13 is simplified, and the size of the device is not increased.

Second Embodiment

A second embodiment according to the invention is now described with reference to FIG. 9.

Figure 9:
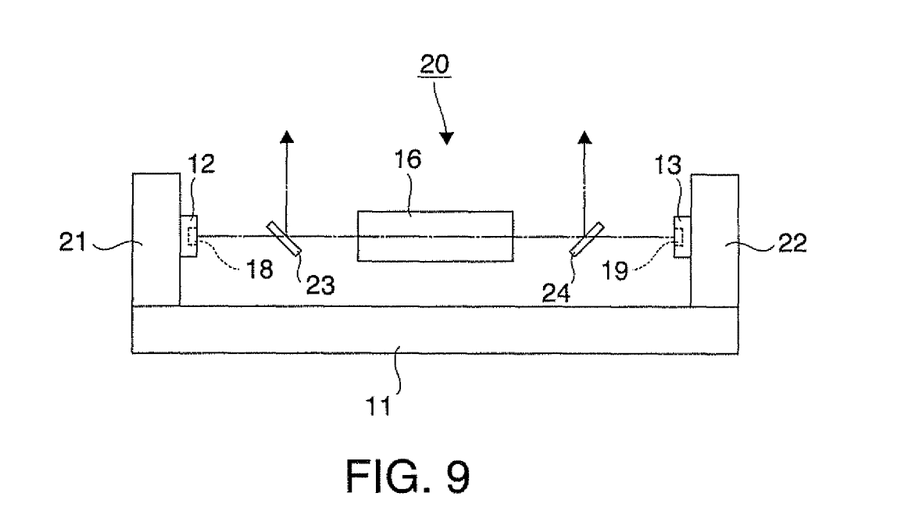
FIG. 9 illustrates the general structure of a laser beam source device according to a second embodiment of the invention.

FIG. 9 schematically illustrates the general structure of a laser beam source device according to this embodiment.

The basic structure of the laser beam source device in this embodiment is substantially similar to that of the laser beam source device in the first embodiment. Thus, the same reference numbers are given to constituent elements in FIG. 9 common to those shown in FIG. 1, and the detailed explanation of the elements is not repeated.

According to the first embodiment, the two laser diodes 12 and 13 are mounted on the single flat substrate 11. In a laser beam source device 20 of this embodiment, however, two supporting members 21 and 22 are fixed to the substrate 11, and the first laser diode 12 and the second laser diode 13 are mounted on the supporting members 21 and 22, respectively, as illustrated in FIG. 9. The emitters 18 and 19 of the respective laser diodes 12 and 13 are disposed opposed to each other, and a first wavelength selecting mirror 23, a wavelength converting element 16, and a second wavelength selecting mirror 24 are disposed in this order on the optical axis of the laser beams emitted from the respective laser diodes 12 and 13.

The first wavelength selecting mirror 23 and the second wavelength selecting mirror 24 have the characteristics opposite to those of the wavelength selecting mirrors in the first embodiment. That is, the first wavelength selecting mirror 23 and the second wavelength selecting mirror 24 transmit infrared light having the fundamental wavelength and emitted from the first laser diode 12 and the second laser diode 13, and reflect visible light converted by the wavelength converting element 16. Thus, lasers are generated by linear reciprocation of the light between the first laser diode 12 and the second laser diode 13, and also the visible light converted by the wavelength converting element 16 is reflected by the first wavelength selecting mirror 23 or the second wavelength selecting mirror 24 and released upward.

Similarly to the first embodiment, the area of the emitter 18 of the first laser diode 12 is different from the area of the emitter 19 of the second laser diode 13. The shapes and the areas of the respective emitters may have variations similar to those shown in FIGS. 2 through 8 of the first embodiment.

The laser beam source device 20 in this embodiment can offer advantages similar to those of the first embodiment. Thus, a laser beam source device capable of lowering the necessary alignment accuracy, generating sufficient lasers, and achieving high output can be manufactured at low cost in a stable manner.

Third Embodiment

Figure 10:
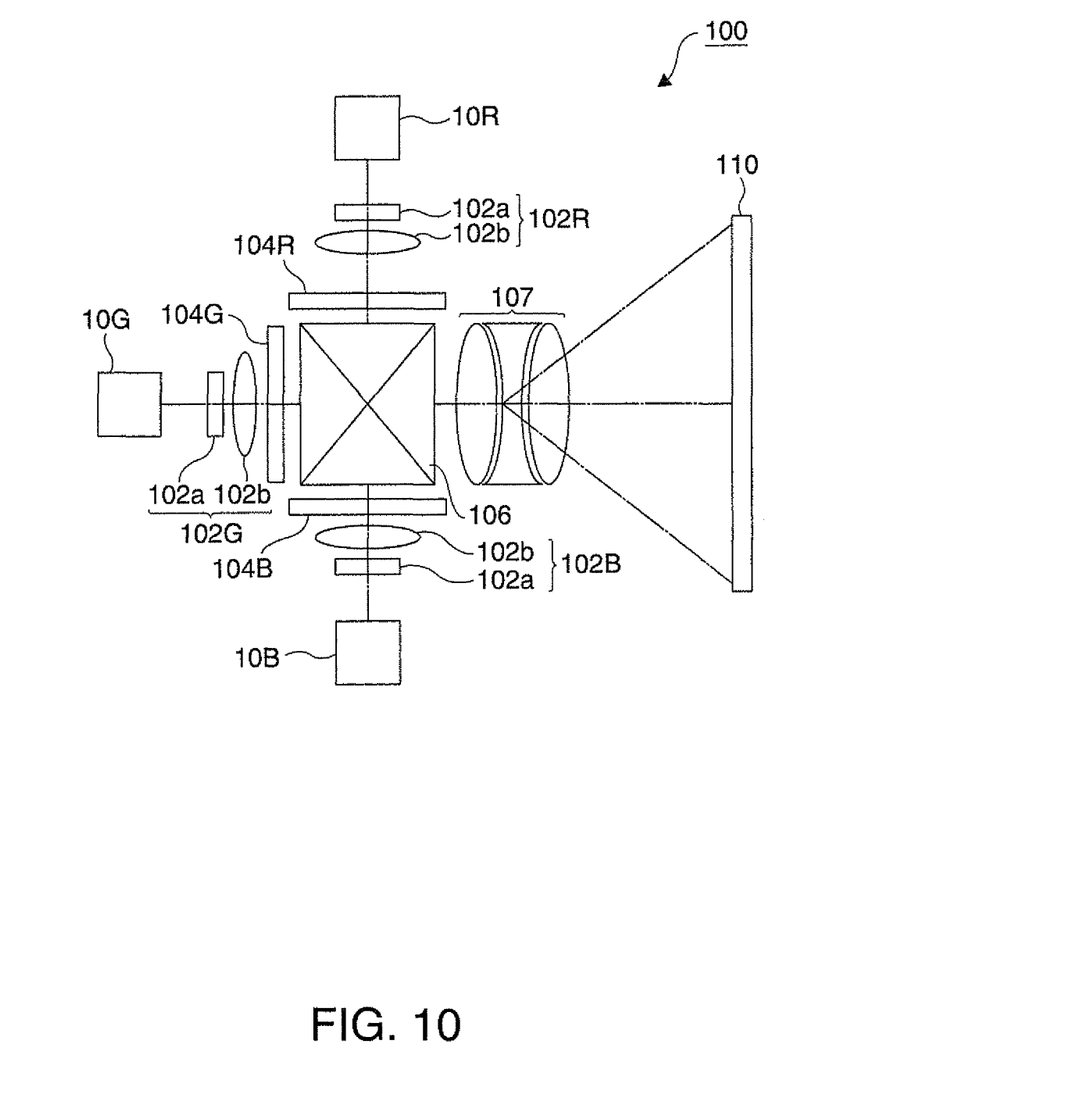
FIG. 10 illustrates the general structure of a projector according to a third embodiment of the invention.

A third embodiment according to the invention is now described with reference to FIG. 10.

In this embodiment, a projector including the light source device according to the first or second embodiment will be discussed. FIG. 10 schematically illustrates the general structure of the projector in this embodiment.

A projector 100 according to this embodiment includes a laser beam source device 10R for read light, a laser beam source device 10G for green light, and a laser beam source device 10B for blue light for emitting red light, green light, and blue light, respectively. Each of the laser beam source devices 10R, 10G, and 10B corresponds to the light source device according to the first or second embodiment.

The projector 100 includes liquid crystal light valves (light modulation devices) 104R, 104G, and 104B for modulating the corresponding color lights emitted from the laser beam source devices 10 (10R, 10G, and 10B), a cross dichroic prism (color combining unit) 106 for combining the lights emitted from the liquid crystal light valves 104R, 104G, and 104E and guiding the combined light to a projection lens 107, and the projection lens (projection unit) 107 for expanding an image formed by the liquid crystal light valves 104R, 104G, and 104E and projecting the image on a screen 110.

The projector 100 further includes equalizing systems 102R, 102G, and 102E for equalizing illuminance distributions of the laser beams emitted from the laser beam source devices 10R, 10G, and 10B such that illumination lights having uniform illuminance distributions can be supplied to the liquid crystal light valves 104R, 104G, and 104B. In this embodiment, each of the equalizing systems 102R, 102G, and 102B contains a hologram 102a and a field lens 102b, for example.

The three color lights modulated by the respective liquid crystal light valves 104R, 104G, and 104B enter the cross dichroic prism 106. This prism is produced by affixing four rectangular prisms, and has a dielectric multilayer film for reflecting red light and a dielectric multilayer film for reflecting blue light disposed in a cross shape on the inner surfaces of the prisms. The three color lights are combined by these dielectric multilayer films to form light representing a color image. Then, the combined light is projected on the screen 110 by using the projection lens 107 as the projection system for display of the expanded image.

According to this embodiment, the projector 100 includes the laser beam source device 10R for red light, the laser beam source device 10G for green light, and the laser beam source device 10B for blue light each corresponding to the light source device according to the first or second embodiment. Thus, the projector 100 becomes a compact and low-cost projector capable of displaying bright images.

While the transmission-type liquid crystal light valves are used as the light modulation devices in this embodiment, the light modulation devices may be reflection-type light valves or light valves of types other than the liquid crystal type. Examples of these light valves involve reflection-type liquid crystal light valves and digital mirror devices. The structure of the projection system is changed according to the types of light valves to be used.

Fourth Embodiment

A fourth embodiment according to the invention is now described with reference to FIG. 11.

In this embodiment, a scanning-type image display apparatus will be discussed. FIG. 11 illustrates the general structure of the image display apparatus according to this embodiment.

Figure 11:
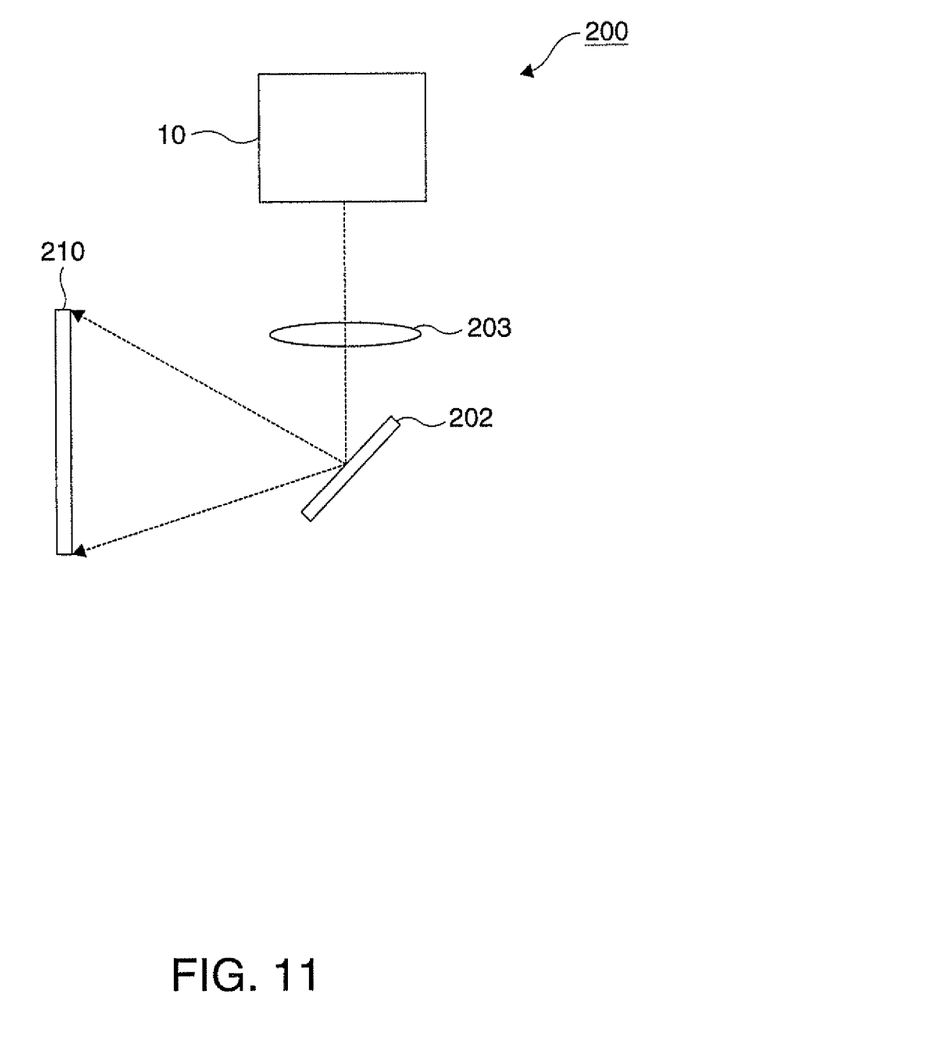
FIG. 11 illustrates the general structure of an image display apparatus according to a fourth embodiment of the invention.

As illustrated in FIG. 11, an image display apparatus 200 in this embodiment includes the laser beam source device 10 according to the first or second embodiment, an MEMS mirror (scanning unit) 202 which applies light emitted from the laser beam source device toward a screen 210 for scanning, and a converging lens 203 for converging the light emitted from the laser beam source device 10 on the MEMS mirror 202. The light received from the laser beam source device 10 is applied to the screen 210 in the horizontal direction and the vertical direction by driving the MEMS mirror 202. For display of color images, plural emitters contained in laser diodes are constituted by combinations of emitters having peak wavelengths in red, green, and blue, for example.

Fifth Embodiment

A structure example of a monitoring device 300 which uses lasers according to the embodiments is now described with reference to FIG. 12.

Figure 12:
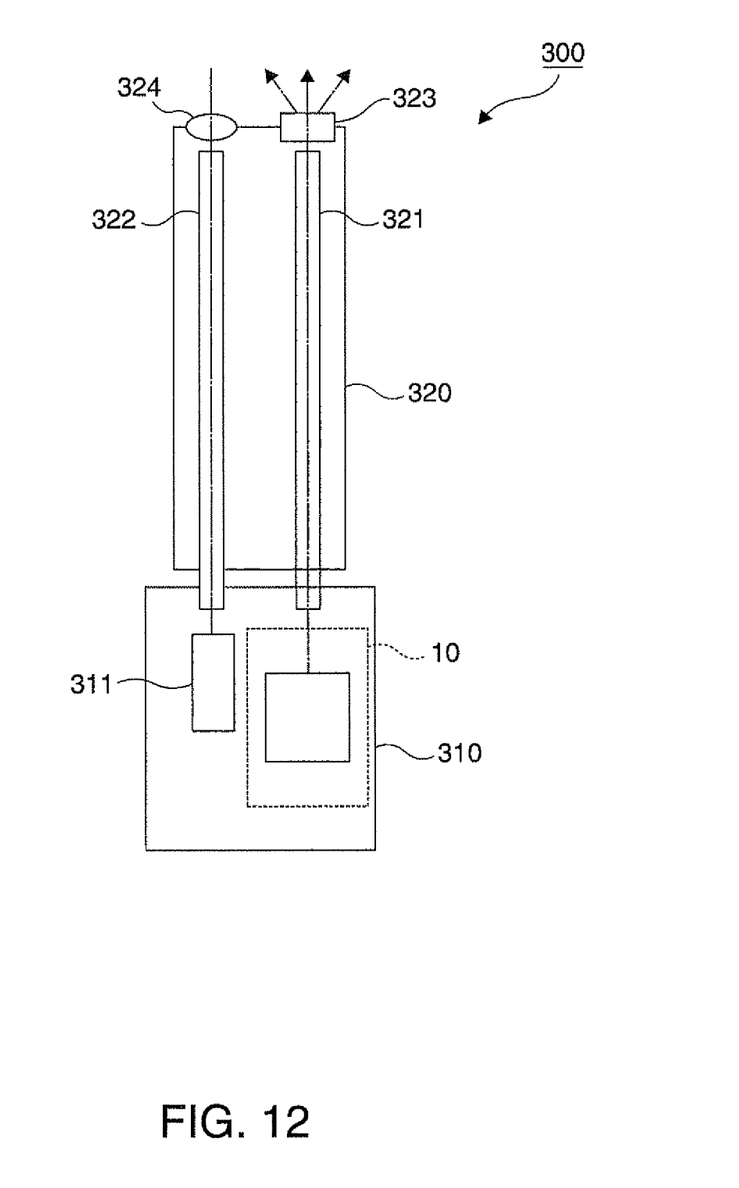
FIG. 12 illustrates the general structure of a monitoring device according to a fifth embodiment of the invention.

FIG. 12 illustrates the general structure of the monitoring device according to this embodiment.

As illustrated in FIG. 12, the monitoring device 300 in this embodiment includes a device main body 310 and a light transmitting unit 320. The device main body 310 contains the laser beam source device 10 according to the first or second embodiment.

The light transmitting unit 320 includes two light guides 321 and 322 on the light sending side and the light receiving side, respectively. Each of the light guides 321 and 322 is produced by binding a number of optical fibers and can transmit laser beams to a distant place. The laser beam source device 10 is provided on the light entrance side of the light guide 321 for sending light, and a diffusion plate 323 is disposed on the light exit side of the light guide 321. The laser beam emitted from the laser beam source device 10 is transmitted to the diffusion plate 323 provided at the end of the light transmitting unit 320 via the light guide 321, diffused by the diffusion plate 323, and applied to a subject.

An image forming lens 324 is equipped at the end of the light transmitting unit 320 such that reflection light from the subject can be received by the image forming lens 324. The received reflection light is transmitted via the light guide 322 on the light receiving side to a camera 311 as an image pickup unit provided on the device main body 310. As a result, an image corresponding to the light reflected by the subject can be captured by the camera 311 by using the laser beam emitted from the laser beam source device 10 and applied to the subject.

According to this embodiment, the monitoring device 300 includes the laser beam source device 10 in the first or second embodiment. Thus, the monitoring device 300 becomes a compact and low-cost device capable of capturing clear images.

The technical range of the invention is not limited to the embodiments described herein but may be modified in various ways without departing from the scope and spirit of the invention. For example, according to the first embodiment, the two laser diodes are mounted on the same substrate, and lights are emitted upward from the respective laser diodes as illustrated in FIG. 1. Then, the lights having the fundamental wavelength are reflected by the wavelength selecting mirrors to be bended in the direction substantially parallel with the substrate surface. According to the second embodiment, the emitters of the laser diodes are disposed directly opposed to each other by using the supporting members. The structures of these embodiments may be combined, for example. That is, one of the laser diodes is mounted on the substrate, and the other laser diode may be provided on the supporting member such that the optical path along which the laser beam reciprocates can be bended into L shape. Furthermore, the specific structures of the laser diodes, the wavelength selecting mirrors, and the wavelength converting elements in a laser beam source device according to the first and second embodiments are not limited to the examples shown herein but may be varied as necessary.

A technical concept possible in light of the teachings of the embodiments and modified examples described herein but not included in the appended claims is now explained along with the advantages provided by the concept.

A laser beam source device includes a first light emission element and a second light emission element each of which has a light emission portion for emitting a laser beam having a fundamental wavelength. The first light emission element and the second light emission element are disposed such that light emitted from the light emission portion of each of the first light emission element and the second light emission element can enter the light emission portion of the other light emission element. The area of the light emission portion of the first light emission element is different from the area of the light emission portion of the second light emission element.

According to this structure, the area of the light emission portion of the first light emission element is different from the area of the light emission portion of the second light emission element disposed optically opposed to the corresponding light emission portion of the first light emission element. In this case, the periphery of the light emission portion having the larger area functions as an alignment margin as viewed from the light emission portion having the smaller area. Thus, even when the alignment of the light emission portion having the smaller area deviates from the light emission portion having the larger area within the range of the alignment margin, the two light emission portions completely overlap with each other.

Thus, the necessary alignment accuracy is lowered, and sufficient lasers can be generated. Accordingly, a laser beam source device capable of achieving high output can be manufactured at low cost in a stable manner. Since the necessary alignment accuracy is lowered, the alignment process can be easily performed by using a simple alignment device. Thus, the laser beam source device can be produced at low cost for the reasons of rapid and high-yield adjustment.

The entire disclosure of Japanese Patent Application No. 2009-268451, filed Nov. 26, 2009 is expressly incorporated by reference herein.

What is claimed is:

1. A laser beam source device comprising:
   a first light emission element and a second light emission element each of which has a light emission portion for emitting a laser beam having a fundamental wavelength, wherein
   the first light emission element and the second light emission element are disposed such that light emitted from the light emission portion of each of the first light emission element and the second light emission element can enter the light emission portion of the other light emission element,
   at least either the first light emission element or the second light emission element has the plural light emission portions, and
   the areas of the plural light emission portions are not uniform.

2. The laser beam source device according to claim 1, wherein the area of the light emission portion included in the plural light emission portions of at least either the first light emission element or the second light emission element and positioned near the end of the element is larger than the area of the light emission portion positioned near the center of the element.

3. The laser beam source device according to claim 1, wherein the areas of the plural light emission portions of at least either the first light emission element or the second light emission element sequentially increase in the direction from one end of the element to the other end of the element.

4. The laser beam source device according to claim 1, wherein the area of the light emission portion of the first light emission element is different from the area of the light emission portion of the second light emission element which receives light emitted from the corresponding light emission portion of the first light emission element.

5. The laser beam source device according to claim 1, further comprising:
   a wavelength converting element which receives lights emitted from the first light emission element and the second light emission element, converts the received lights into lights having a converted wavelength different from the fundamental wavelength, and releases the converted lights; and
   dividing elements disposed on optical paths between the wavelength converting element and the first light emission element and between the wavelength converting element and the second light emission element to selectively transmit either the laser beam having the converted wavelength or the laser beam having the fundamental wavelength and selectively reflect the other laser beam.

6. The laser beam source device according to claim 5, wherein
   the first light emission element and the second light emission element are mounted on the same substrate; and
   the laser beam having the fundamental wavelength and emitted from either the first light emission element or the second light emission element is reflected by the one dividing element, supplied to the wavelength converting element, released from the wavelength converting element, reflected by the other dividing element, and supplied to the other light emission element.

7. The laser beam source device according to claim 6, further comprising an optical path changing unit which bends the optical path of the laser beam emitted from either the first light emission element or the second light emission element and transmitted by the other dividing element substantially in the same direction as the direction of the optical path of the laser beam emitted from the other light emission element and transmitted by the one dividing element.

8. A projector comprising:
   the laser beam source device according to claim 1;
   a light modulation device which modulates a laser beam emitted from the laser beam source device according to an image signal; and
   a projection device which projects light modulated by the light modulation device.

9. A monitoring device comprising:
   the laser beam source device according to claim 1; and
   an image pickup unit which captures an image of a subject by using light emitted from the laser beam source device.

* * * * *